United States Patent [19]
Sheldon

[11] Patent Number: 5,588,995
[45] Date of Patent: Dec. 31, 1996

[54] SYSTEM FOR MONITORING THE GROWTH OF CRYSTALLINE FILMS ON STATIONARY SUBSTRATES

[75] Inventor: Peter Sheldon, Lakewood, Colo.

[73] Assignee: Midwest Research Institute, Kansas City, Mich.

[21] Appl. No.: 434,181

[22] Filed: May 3, 1995

Related U.S. Application Data

[62] Division of Ser. No. 69,405, Jun. 1, 1993, Pat. No. 5,456,205.

[51] Int. Cl.⁶ .................................................. C30B 25/16
[52] U.S. Cl. .......................... 117/201; 117/106; 117/108; 118/715
[58] Field of Search ........................... 118/715; 117/106, 117/108, 201

[56] References Cited

U.S. PATENT DOCUMENTS

5,100,832  3/1992  Kitagawa et al. ..................... 437/106
5,122,222  6/1992  Turner et al. ......................... 422/105
5,200,021  4/1993  Kawai et al. ......................... 118/665
5,238,525  8/1993  Turner et al. ......................... 118/716
5,270,797  12/1993 Pollack et al. ....................... 356/417

Primary Examiner—Robert Kunemund
Attorney, Agent, or Firm—Edna M. O'Connor

[57] ABSTRACT

A system for monitoring the growth of crystalline films on stationary or rotating substrates includes a combination of some or all of the elements including a photodiode sensor for detecting the intensity of incoming light and converting it to a measurable current, a lens for focusing the RHEED pattern emanating from the phosphor screen onto the photodiode, an interference filter for filtering out light other than that which emanates from the phosphor screen, a current amplifier for amplifying and convening the current produced by the photodiode into a voltage, a computer for receiving the amplified photodiode current for RHEED data analysis, and a graphite impregnated triax cable for improving the signal to noise ratio obtained while sampling a stationary or rotating substrate. A rotating stage for supporting the substrate with diametrically positioned electron beam apertures and an optically encoded shaft can also be used to accommodate rotation of the substrate during measurement.

21 Claims, 9 Drawing Sheets

FIG. 16

SYSTEM FOR MONITORING THE GROWTH OF CRYSTALLINE FILMS ON STATIONARY SUBSTRATES

CONTRACTUAL ORIGIN OF THE INVENTION

The United States Government has rights in this invention under Contract No. DE-AC0283CH10093 between the U.S. Department of Energy and the National Renewable Energy Laboratory, a Division of Midwest Research Institute.

This is a Division of application Ser. No. 08/069,405 filed Jun. 1, 1993 now U.S. Pat. No. 5,456,205.

BACKGROUND OF THE INVENTION

1. Field of the Invention

The present invention relates to thin film deposition, and more particularly to a method and apparatus for monitoring the growth rate of single crystal films on stationary or revolving substrates, in which the thickness of the thin film is measured in terms of monolayer units.

2. Description of the State of the Art

Molecular beam epitaxy (MBE) is a versatile, thin film growth technique used in preparing high-quality, single crystal thin film materials and structures for fundamental studies and for manufacturing electronic devices, such as semiconductors. In order to engineer and obtain precise quality control over thin film components of microelectronic devices for desired band gaps, doping, junction structure, and the like, it is necessary that the thicknesses of these films be precisely monitored as they are grown to a predetermined number of atomic layers or monolayers. Such thicknesses are usually discussed in angstrom units (Å), but the raw measurement can be made by monitoring the crystalline layers as they grow. Since it is known for each material, such as silicon, how thick each crystalline layer or monolayer is in angstrom units, monitoring and identifying each new crystal lattice layer as it is grown can provide the basis for calculating the overall thickness in angstrom units. Also, by determining the number of layers grown per unit of time and multiplying by the angstroms of thickness per monolayer can yield angstroms of growth per unit of time. Thus, the device can be designed by time of deposition with a particular constituent flux to yield the desired crystalline thickness in the film deposited. Consequently, accuracy within the range of one or two monolayers is needed.

There have been significant research efforts expended on developing real-time methods of determining and monitoring when a monolayer has in fact been deposited, and to thereby control the supply of the vapor phases of the materials being deposited.

Of the various methods developed for measuring the thickness of a crystalline film that is being grown on a substrate in a molecular beam epitaxy (MBE) chamber, a reflection high energy electron diffraction (RHEED) system is the most desirable. In a conventional RHEED system, a beam of high-energy (5 to 40 KeV) electrons is directed at the surface of the crystalline film growing in the MBE chamber at a grazing angle (one to two degrees to the plane of the surface). Because of the shallow incident angle, the electrons penetrate the surface of the growing crystalline film only a few atomic layers, and the resulting diffraction pattern of the electron beam is projected onto a phosphor screen positioned at the other side of the substrate. The projected pattern of electrons impinging the phosphor screen is therefore indicative of the crystalline surface, giving a measure of crystalline quality as well as a number of lattice conditions. It has further been established that once crystalline growth is initiated, there are oscillations in electron impingement intensity on portions of the phosphor screen related to fractional changes in surface atomic coverage. These temporal oscillations correspond to the growth of crystalline layers of the film and, when plotted versus time, can show a growth rate of the thin film.

In appropriate conditions, the deposition of materials, such as GaAs or other III-V compounds, proceeds in a crystal growth model characterized layer by layer as the incoming flux condenses on the crystalline substrate, so the resulting RHEED output oscillations can be correlated to development or growth of individual monolayers of the film. This current model of crystal growth explains the RHEED pattern oscillation as well as inevitable dampening of the oscillations as the film grows thicker. Prior to deposition the equilibrium surface is assumed to be smooth, which equates with minimal surface roughness, thus maximum reflectivity. When growth is initiated, submonolayer coverage produces island-like clusters randomly deposited over the surface of the substrate forming a somewhat "rough" appearance. Consequently, where the starting smooth surface caused little scattering of the electron beam and a light, intense pattern of electron incidence on a spot or location on the phosphor screen, the island-like crystals reduce reflectivity and tend to scatter the reflected electron beam. When the nascent crystalline layer is half-filled with atoms, the surface is at its "roughest," thus the reflectivity is at a minimum and electron beam scattering is at a maximum. The result is a decrease in intensity of electron incidence on that original projected spot or location on the phosphor screen. As more atoms are deposited and the monolayer nears completion, the roughness of the surface decreases again, and the resulting scattering of the incident electron beam also decreases. Therefore, the intensity of electron impingement on the original projected spot or location on the phosphor screen increases again. Consequently, a plot of intensity at the original projected spot on the phosphor screen versus time shows one oscillation of electron impingement intensity between two adjacent high values for each monolayer deposited. However, the surface of the newly deposited layer does not become entirely smooth, because the next succeeding layer often nucleates and starts to grow prior to the complete formation and lattice fill of the currently forming layer. Therefore, the intensity differential, detected on the phosphor screen, between the maximum and minimum in reflectivity gradually decreases after each successive layer, thus giving rise to a damping effect of each successive intensity oscillation. This cycle repeats itself over and over, giving rise to RHEED oscillations and the gradual damping of the same. Consequently, while one period of the intensity oscillation corresponds to exactly one monolayer, each successive oscillation becomes less pronounced and more difficult to detect or read. The result is that conventional RHEED oscillations are easy to detect and read for the first few crystalline layer formations; however, they rapidly become unreadable and useless for monitoring layer formation or crystalline growth.

There have been some apparatus and methods developed for monitoring the growth of thin films that do utilize RHEED oscillations, as described above. For example, G. W. Turner, et al. in a technical publication, entitled "Frequency-Domain Analysis of Time-Dependent Reflection High-Energy Electron Diffraction Intensity Data," J. Vac. Sci. Technol. B, Vol. 8, No. 2 pp 283–287, 1990, discloses a RHEED video system in which a video camera is focused on the phosphor screen. The video signal resulting from light produced by electron impingement on the phosphor screen is directed through a computer interface to a video monitor, where the image of the light emanating from the phosphor screen is displayed and broken down into a matrix of pixels. The intensity of these pixels, which are directly related to the intensity of the light emanating from the phosphor screen, are then stored as a function of time. The Eckstein et al., patent, U.S. Pat. No. 4,812,650 discloses a method of monitoring oscillations obtained by measuring the current density of photoemitted electrons in-situ, produced by irradiating the crystalline film with a hydrogen/deuterium UV light source. U.S. Pat. No. 4,855,013, issued to Ohta et al., discloses an improved method of monitoring approximately 400 oscillations by way of a RHEED measurement system, thus, allowing the growth to be measured for the first 1000 Å of an AlGaAs alloy grown at an average growth rate of 5000 Å/hour.

The above technical paper and patents each have certain disadvantages, in regard to the combination of monitoring and growth techniques employed, as a trade off for certain advantageous features. For example, the video system utilized by Turner et al. has the advantage of being capable of monitoring the intensity of multiple light spots on the phosphor screen, thus electron diffraction patterns incident on the phosphor screen. However, it has a poor dynamic range, poor sensitivity, and poor signal to noise ratio, which results in a decrease in the number of oscillations, thus numbers of crystalline layers, capable of being monitored. Ohta et al. discloses a great improvement over the prior art in that the ability to monitor crystal growth was increased approximately ten fold. However, a relatively slow growth rate was employed (which enhances the number of observable oscillations). In addition, Al containing alloys (such as AlGaAs) sustain oscillations for a longer period of time as compared to GaAs. Further, to minimize uneven crystal growth, the substrate should be rotated during the thin film deposition, but both Turner et al. and Ohta et al. require stationary substrates and cannot accommodate rotating substrates. Eckstein et al. did rotate the sample substrate for greater uniformity; however, they were not able to use a RHEED measurement system because of the rotation. Consequently, Eckstein et al. could only monitor the growth rate to approximately 28 Å.

There is still a need, therefore, for a system or technique for monitoring crystal growth by layers very accurately for larger thicknesses during higher growth rates than has been achieved by the prior art. There is also a need for a system that can make such measurements at such accuracies in such high growth rates, but which can also accommodate rotating substrates.

SUMMARY OF THE INVENTION

Accordingly, it is a general object of this invention to provide an improved method for monitoring crystal growth in a high vacuum system.

A more specific object of the invention is to improve the resolution and sensitivity of the oscillations measured, thereby enabling, monitoring and controlling the thickness of thin crystal film growth to larger thicknesses during higher growth rates.

Another specific object of this invention is to provide a system for monitoring crystal layer growth and higher growth rates through thicker growth ranges and that can also accommodate such measurements on a rotating substrate during MBE growth.

An additional object of the present invention is to monitor crystal growth on a rotating substrate while using a RHEED system.

Additional objects, advantages and novel features of this invention shall be set forth in part in the description that follows, and in pan will become apparent to those skilled in the art upon examination of the following specification or may be learned by the practice of the invention. The objects and advantages of the invention may be realized and attained by means of instrumentalities, combinations, and methods particularly pointed out in the appended claims.

To achieve the foregoing and other objects and in accordance with the purposes of the present invention, as embodied and broadly described therein, the apparatus of this invention may comprise various combinations of some or all of the elements including a photodiode sensor for detecting the intensity of incoming light and converting it to a measurable current, a lens for focusing the RHEED pattern emanating from the phosphor screen onto the photodiode, an interference filter for filtering out light other than that which emanates from the phosphor screen, a current amplifier for amplifying and converting the current produced by the photodiode into a voltage, a computer for receiving the amplified photodiode current for RHEED data analysis, and a graphite impregnated triax cable for improving the signal to noise ratio obtained while sampling a stationary or rotating substrate. A rotating stage for supporting the substrate with diametrically positioned electron beam apertures and an optically encoded shaft can also be used to accommodate rotation of the substrate during measurement. The method of this invention may include synchronizing rotation of the substrate with intermittent sampling of the RHEED pattern, allowing a single measurement to be taken per revolution.

BRIEF DESCRIPTION OF THE DRAWINGS

The accompanying drawings, which are incorporated in and form a part of the specifications, illustrate the preferred embodiments of the present invention, and together with the descriptions serve to explain the principles of the invention.

In the Drawings.

DETAILED DESCRIPTION OF THE PREFERRED EMBODIMENT

Figure 1:
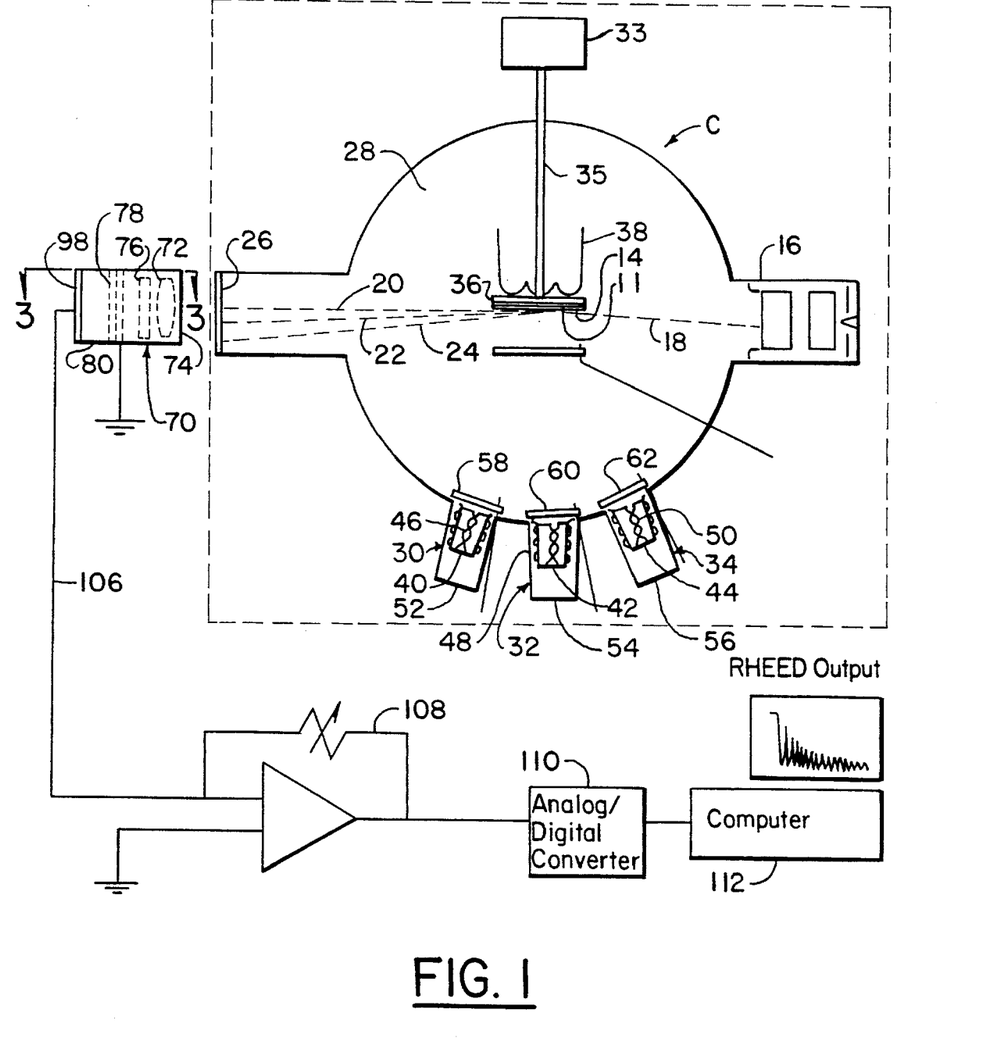
FIG. 1 is a schematic view showing an MBE crystal growth apparatus equipped with the improved RHEED detecting system according to this invention.

The crystal growth monitoring apparatus 10, according to this invention, is shown in FIG. 1, in combination with a conventional MBE crystal growth module C. Essentially, MBE is a straight forward deposition process in which thermally generated molecular or atomic beams of vaporous materials are deposited and crystallized on the surface of a suitably oriented substrate or wafer 11. Monitoring the growth of this newly formed sample or thin crystal film 14 may be accomplished by use of an analytical instrument, such as a reflection high energy electron diffraction (RHEED) gun or electron gun 16, which emits a beam 18 of high energy electrons directed toward the surface of crystal film 14 at a very low incident angle. The electron beam 18 is reflected off the surface of the substrate 11 in a more or less scattered pattern of diffracted high energy electron beams 20, 22 and 24, dependent on the surface reconstruction of the crystalline surface. The diffracted electron beams 20, 22, and 24 are projected to and absorbed by a phosphor screen 26, and, as discussed in detail below, the projected RHEED pattern on the phosphor screen 26 is indicative of the various stages of growth of the crystal film 14. A characteristic of a phosphor screen, such as the phosphor screen 26, is that the electrons striking the phosphor screen 26 are absorbed and the energy is convened into light energy or photons that emanate from the phosphor screen and are visible. Furthermore, the intensity of the light energy emanating from any portion of the phosphor screen 26 is directly related to the intensity of the electrons impinging on that portion of the phosphor screen 26. Therefore, the intensity of light emanating from a portion of the phosphor screen 26 can be monitored as an indication of the crystal growth, as will be described in more detail below.

Detector apparatus 70 positioned behind the phosphor screen 26 converts the light energy emanating from the phosphor screen 26 into an electronic signal or a current that can be measured. The more intense the light energy emanating from the phosphor screen 26, the higher the current will be. Likewise the less intense the light energy, the lower the current will be. In the preferred embodiment of this invention, the current is conducted from the detector apparatus 70, preferably via a graphite impregnated low noise triax cable 106, into a Kiethley 427 current amplifier 108, where the current is amplified and convened into a voltage which is proportional to the current. The 0–10 volt output of the current amplifier is directed into an analog to digital converter 110 that converts the voltage output of the amplifier 108 from an analog waveform into digital information for subsequent processing by a computer 112, such as, for example a Macintosh IIx. The computer 112 utilizes a reflection high energy electron diffraction (RHEED) data acquisition and analysis software package to perform frequency-domain analysis of dynamic RHEED intensity data obtained during crystal growth by molecular beam epitaxy. This improved technique according to this invention allows useful growth rate information, which has been shown to be readable and useful clear out to 0.75 µm or 7500 Å of crystal growth at higher growth rates than has been available before.

In practice, a conventional crystal growth module C, shown in FIG. 1, comprises a chamber 28, source cells 30, 32, 34, a substrate stage 36 for wafer 11 manipulation, and an analytical instrument, such as an electron gun 16, for emitting a beam 18 of high energy electrons toward wafer 11 and phosphor screen 26. A wafer or substrate 11 on which the crystalline thin film is to be deposited or "grown" is mounted on a substrate stage 36 located in the center of the growth chamber 28. A heating element 38 is typically positioned adjacent sample stage 36 to maintain the substrate 11 at a desired process temperature for the thin film 14 that is being grown. A motor 33 connected to the stage 36 can be used to rotate the stage 36 and substrate 11 during deposition, which is often desirable or necessary to achieve a uniform growth of the crystalline thin film 14 on the substrate 11.

Crystal deposition occurs as a result of molecular or atomic beams being generated by heating solid or source materials, such as Al, Ga, and As, placed in source cells 30, 32, and 34, respectively, to temperatures that will produce the appropriate vapor pressures. Each source cell 30, 32, 34 may comprise an elongated pyrolytic boron nitride (PBN) crucible 40, 42, 44, respectively, each of which contains one of the flux or vaporant materials, e.g., the Al, Ga, and As. Heating filaments 46, 48, and 50 adjacent or wound around crucibles 40, 42, and 44, respectively, are used for heating the source materials to their respective temperatures by resistive heating. The source cells 30, 32, and 34 can also be surrounded by liquid nitrogen shrouds 52, 54, and 56, respectively, that help reduce the thermal crosstalk between sources and vapor contamination. Shutters 58, 60, and 62 are movably positioned above source cells 30, 32, and 34, respectively. The opening of shutters 58, 60, and 62 release the evaporant or flux in the respective cells 30, 32, and 34 in the form of a molecular or atomic beams (not shown), which migrate to and deposit on the surface of the substrate 11. A suitable MBE chamber C with the features described above can be a model MBE-400, manufactured by Perkin-Elmer, Physical Electronics Division, of Eden Prairie, Minn., USA. The electron gun 16, such as a model 06-190, manufactured by Perkin-Elmer, Physical Electronics Division, of Eden, Minn., produces a beam 18 of high-energy (5 to 10 KeV) electrons that are directed at the surface of the growing thin film 14 on the substrate 11 at a grazing angle (approximately one or two degrees to the plane of the surface), and the resulting diffracted electron beams, such as the diffracted beams 20, 22, and 24 in FIG. 1, are projected onto phosphor screen 26.

Figure 2:
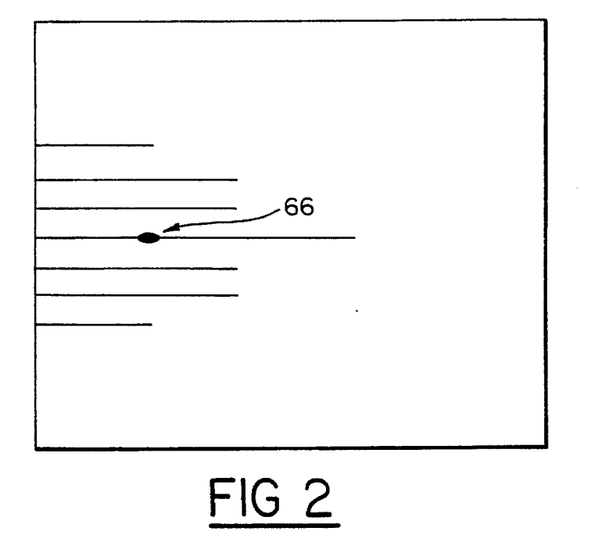
FIG. 2 is an illustration of a typical RHEED diffraction pattern displayed as light emanating from a phosphor screen as used in this invention.

Initially, when the electron beam 18 is reflected off the smooth surface of the substrate, there is little scattering or diffraction, so the specularly reflected electron beam impinges quite intensely and tightly on one spot or location on the phosphor screen 26, thereby producing a fairly intense light emanating from that spot on the phosphor screen 26. The initial spot may be, for example, the specularly reflected spot 66 on phosphor screen 26 illustrated in FIG. 2. As the thin film 14 is deposited on substrate 11, island-like fine crystals begin to grow in a cluster-like manner in random positions over the surface of substrate 11, forming an incomplete monolayer that tends to scatter the electron beam 18. When the nascent crystalline layer 14 is about half-filled with atoms, the surface is at its "roughest," thus the scattering is at a maximum, resulting in a decrease in intensity of the light emanating from the initial spot 66 on the phosphor screen 26 in FIG. 2. As more atoms are deposited and the crystalline lattice or monolayer becomes complete, the roughness of the surface of the film 14 in FIG. 1 decreases, and the resulting scattering of the incident electron beam 18 also decreases, thus the intensity of light emanating from the initial spot 66 on the phosphor screen 26 increases again. This cycle repeats itself as each new crystal monolayer of film 14 grows on the substrate 14, even though it dampens for each successive layer, as described above. Consequently, the waxing and waning of the intensity of light emanating from the initial spot 66 on the phosphor screen 26 is indicative of the phase of crystal growth of each new monolayer of the film 14 on substrate 11.

Detector apparatus 70 according to the present invention is mounted behind the phosphor screen 26 to convert the RHEED diffraction variations into electrical signals. Essentially, the detector apparatus 70 is preferably focused to detect the intensity of light emanating from the phosphor screen 26 and to produce an electrical current corresponding to the variations of light intensity. Since the specularly reflected spot at location 66 of the diffraction pattern D on phosphor screen 26 has the brightest or most intense light emanating therefrom, and since the intensity of light emanating from that spot oscillates in relation to the growth of monolayers of the crystalline film, as described above, it is preferred, although not necessary, to monitor that spot or location 66. To do so, only light emanating from that first spot or location 66 is focussed onto a photosensitive device or photodiode 78 to produce an electric current or instrumentation signal that varies in direct relation to the intensity of the light.

The detector apparatus 70 preferably, although not necessarily, comprises a 20× objective lens 72 having an integral aperture 74 for focusing on the selected light spot 66 of the RHEED diffraction pattern D on the phosphor screen 26. The detector apparatus 70 is preferably mounted on an x-y translation stage so that it can be moved in relation to the phosphor screen 26 to allow the lens 72 to capture the light image of the spot 66. The objective lens 72 focuses the light emanating from phosphor screen 26 through a spectral selective filter 76 onto a photodiode 78, which is preferably, although not necessarily, operated in the photovoltaic mode i.e., in the same manner as a photovoltaic cell, which produces a voltage and a current with an amplitude that is indicative of the intensity of the impinging photons (light energy) on its incident surface.

Figure 3:
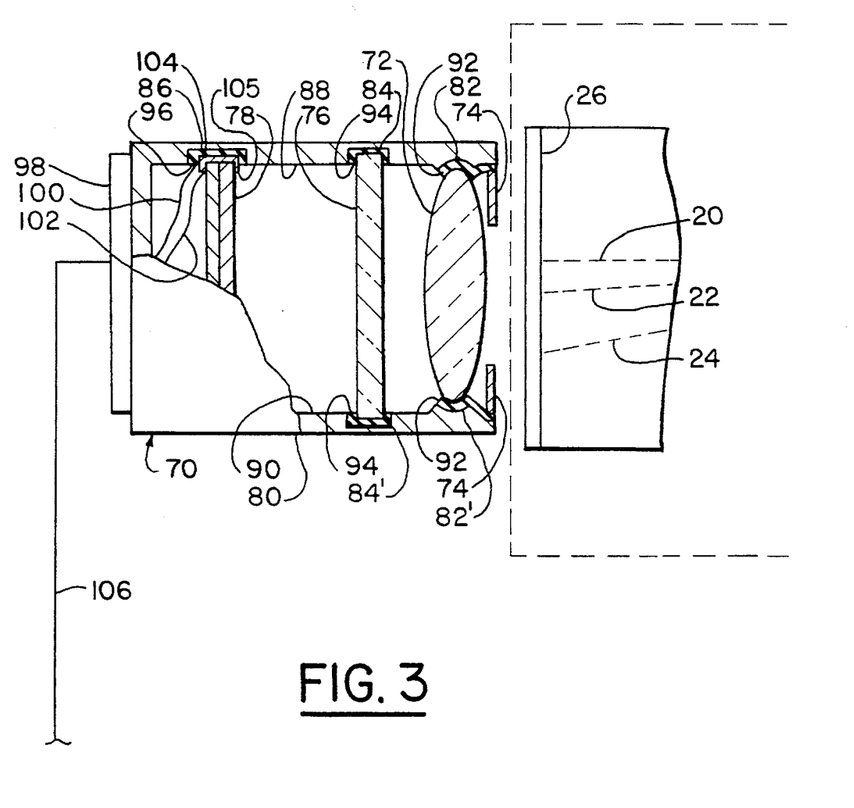
FIG. 3 is an enlarged elevation view of the housing of the improved RHEED detector system of this invention with portions cut away to reveal the operational components.

In the preferred embodiment illustrated in FIG. 3, the detector apparatus 70 includes a body 80 for mounting and enclosing the objective lens 72, interference filter 76, and photodiode 78. The detector body 80, is preferably, although not necessarily, made of black anodized aluminum to absorb and suppress stray light. These individual components 72, 76, and 78 can be held in position by grooves 82, 82', 84, 84', 86, and 86', which have been machined into the walls 88 and 90 of body 80, and rubber inlays 92, 94, and 96, respectively, for providing more support to the objective lens 72, filter 76, and photodiode 78.

Figure 4:
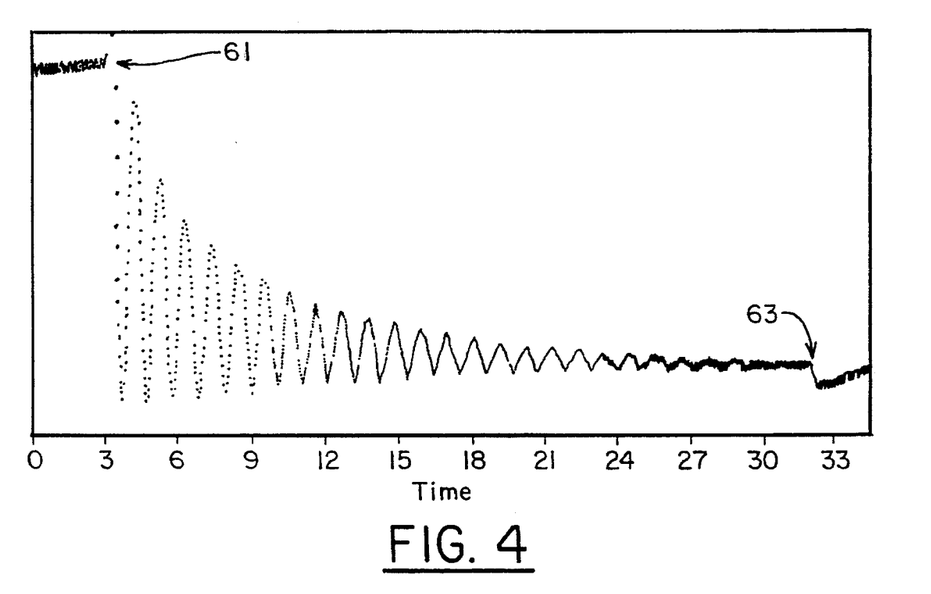
FIG. 4 is a waveform diagram plotting the intensity of the light irradiance emanating from the RHEED phosphor screen versus time to illustrate the oscillating and damping characteristics of the RHEED signals as well as the masking effect which stray background radiation has on useful data.
Figure 5:
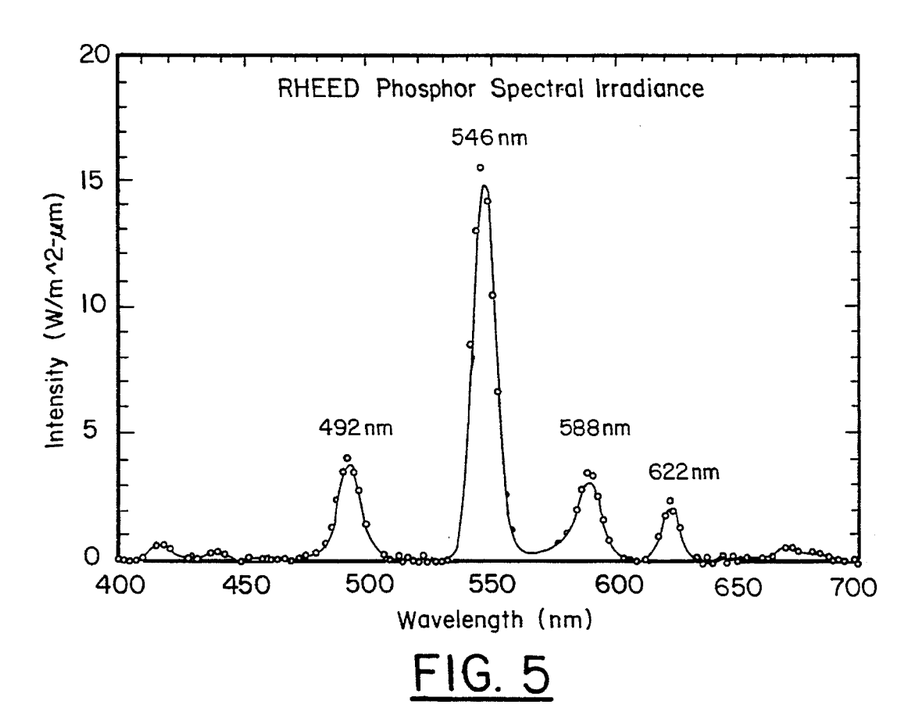
FIG. 5 is a plot of the spectral distribution of light emanating from the RHEED phosphor screen.

Stray background light, which may be collected inadvertently from room lights, ionization gauges in the system, oven filaments, and other sources can be collected by the lens 72 and focused on the photodiode 78, in spite of the black anodized aluminum body 80. Such background light can mask or interfere with useful data. An example of the effect of stray infra-red radiation on the intensity oscillations sampled at the reflection point in the RHEED diffraction pattern D is illustrated in FIG. 4. For example, each "hot" oven contributes to the background level of infra-red radiation to a greater or lesser extent (dependent on temperature). In addition, there are a number of other sources of infra-red radiation, such as hot filaments associated with ionization gauges, the election gun, etc. Each of these sources produces infra-red radiation, which varies with time and contributes to the background light level sensed by the detector. The extraneous signals could be converted to electrical signals, which can mask the RHEED oscillations sought to be detected. In order to filter out effects of stray background infrared radiation, a bandpass filter 76 having a transmission window that matches the luminescence of the phosphor screen 26 is provided. The phosphor screen 26 spectral irradiance can be characterized, as shown in FIG. 5, to show where the primary light wavelength emanating from the phosphor screen 26 exists. In the example of FIG. 5, it is apparent that the primary light component has a wavelength in the range of about 546 nm. Using this information, a bandpass interference filter 76 centered at the wavelength of the principle useful light, i.e., about 546 nm, can be interposed between the objective lens 72 and the photodiode sensor 78. Such a filter for this example could be a bandpass interference filter centered at 546 nm with a 10 nm half width available from ESCO Products, filter part no. 5915461. Consequently, the only light capable of traversing interference filter 76 to be focused on the photodiode sensor 78 is that which is emitted from the phosphor screen 26 resulting from the RHEED diffraction pattern D.

Figure 14:
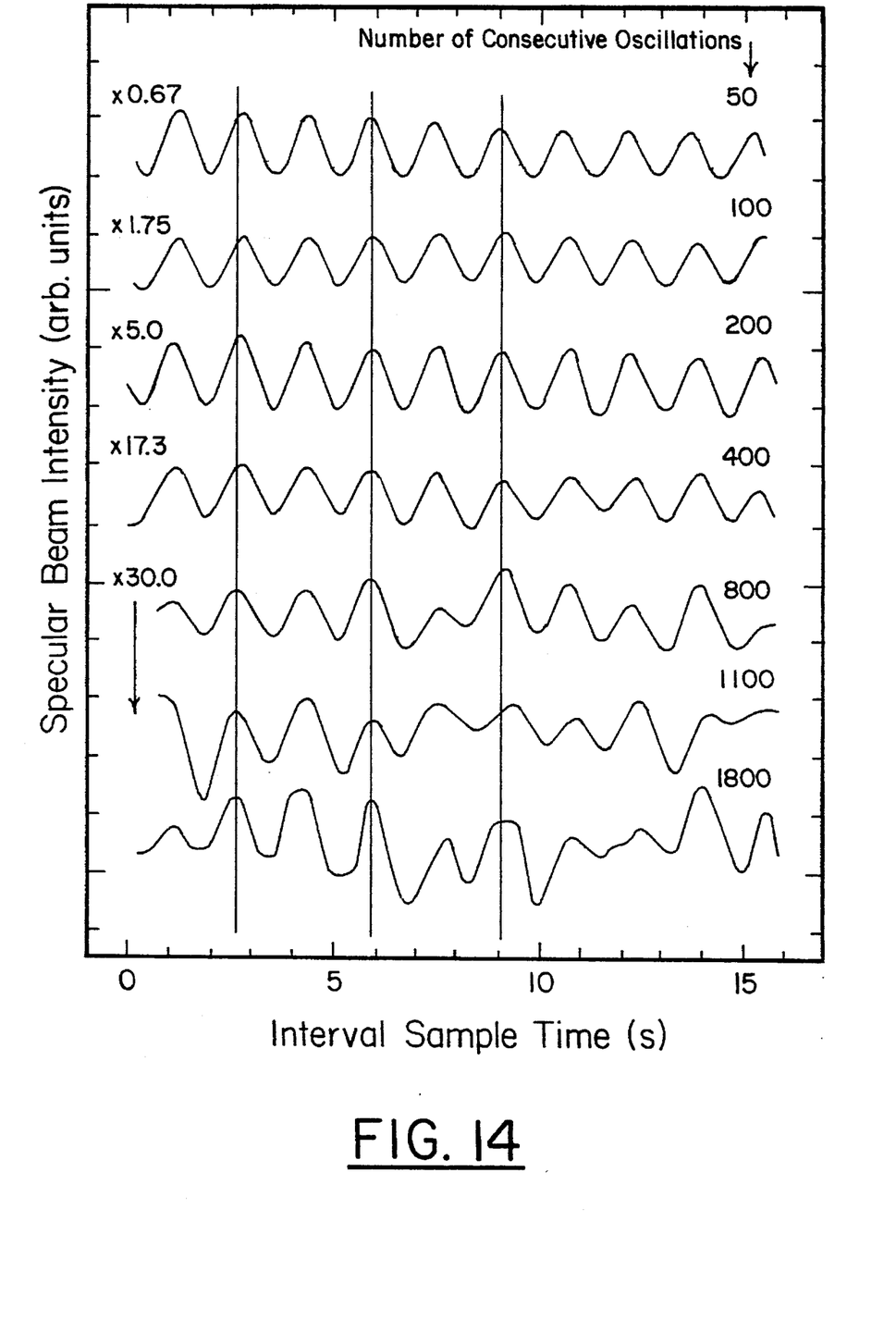
FIG. 14 is a waveform diagram illustrating, at various points in time, the variations in the amplitude of the intensity at the specular point in the diffraction pattern obtained during the growth of a film in one embodiment of the present invention.

Leads 100 and 102 originating from photodiode terminals 104 and 105, respectively, are connected to the triax bulkhead connector (not shown), which receives a low-noise graphite impregnated triax cable 106 for relaying the current produced from of the photodiode 78 into the current amplifier 108, thereby minimizing noise generated from the triboelectric effect. The amplifier 108, as discussed above, outputs a voltage with a magnitude between 0–10 volts that is directly proportional to the current input, i.e., to the current produced by the photodiode 78. The 0–10 V output of the current amplifier 108 is directed into the hybrid analog to digital converter 110 where the analog information is converted into digital information capable of being utilized by a computer 112. The Macintosh IIx computer 112 is equipped with commercially available computer software, such as "National Instruments Lab Windows®," that is further described in the paper published by G. W. Turner et al., cited previously, can be used with appropriate modifications for particular system hardware and other parameters that would be within the capabilities of persons skilled in this art. A RHEED data acquisition and analysis software package run by the Macintosh IIx computer 112 allows frequency domain analysis (via a fast Fourier transform routine) on the time dependent RHEED intensity data. This technique allows for time dependent RHEED oscillation information to be transformed into the frequency domain providing accurate growth rates even in cases where the signal to noise ratio is insufficient to allow for analysis by conventional means. As demonstrated in a later example, flux rate information of 7500 Å may be obtained. FIG. 14 illustrates data up to 5090 Å of growth material. The RHEED data acquisition and analysis software can include, for example, National Instruments Lab Window® as further described in the paper published by G. W. Turner et al., which was cited above. Appropriate modifications for particular system hardware and other parameters may be required, as is well within the knowledge and capabilities of persons skilled in this art.

Figure 6:
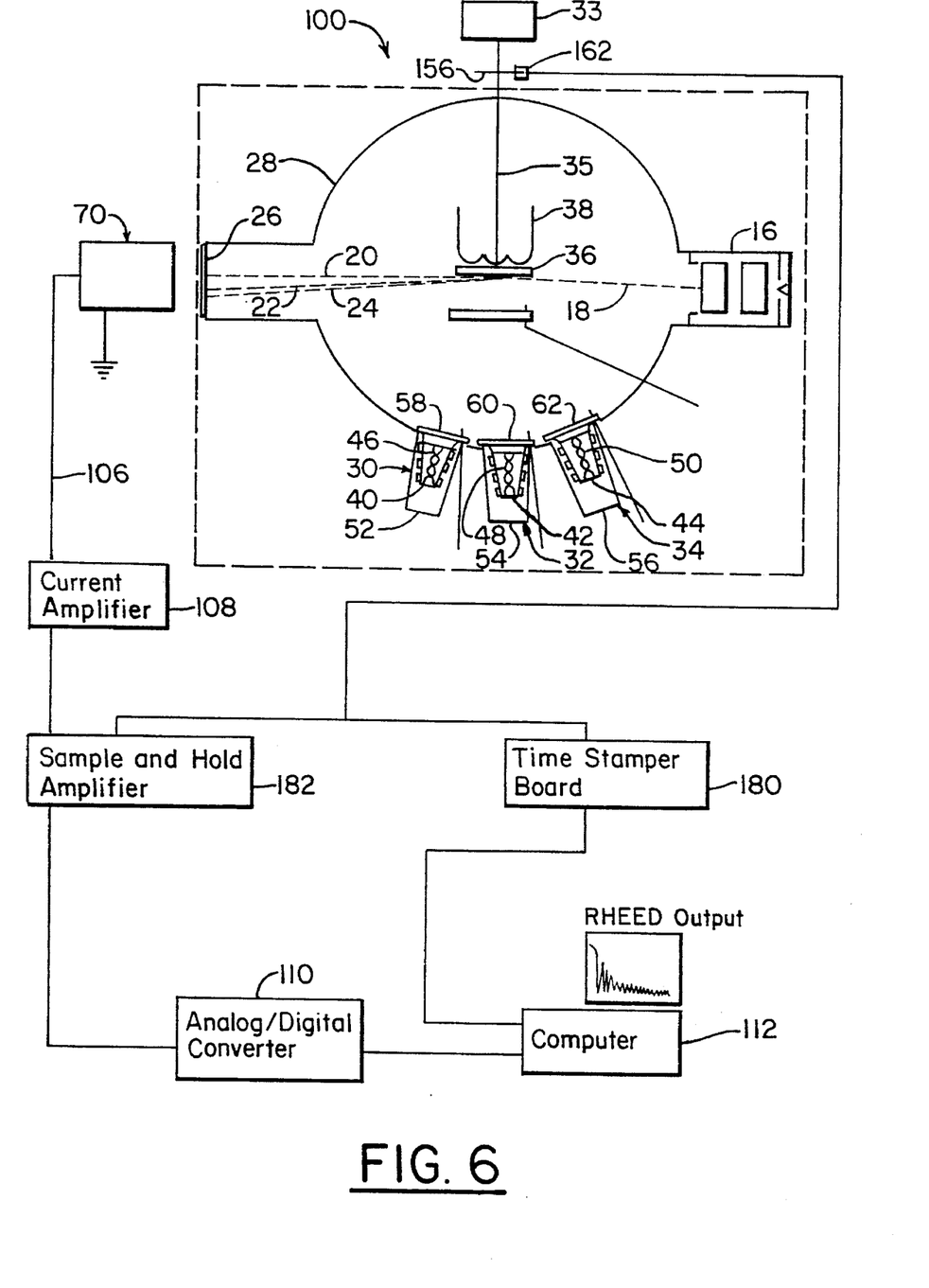
FIG. 6 is a schematic view showing a second embodiment crystal growth apparatus of the present invention having an optically encoded shaft attached to the atmosphere side of the substrate drive mechanism.

An preferred alternate embodiment 100 shown in FIG. 6 may accommodate RHEED oscillation readings while rotating the substrate 11 on which the film 14 is being grown. In this proposed embodiment 100, the stage 36 is mounted on an optically encoded shaft 35. A substrate drive mechanism or motor 33 may be connected to the shaft 35 rotating the shaft 35 and stage 36, thus rotating the substrate 11.

Figure 13:
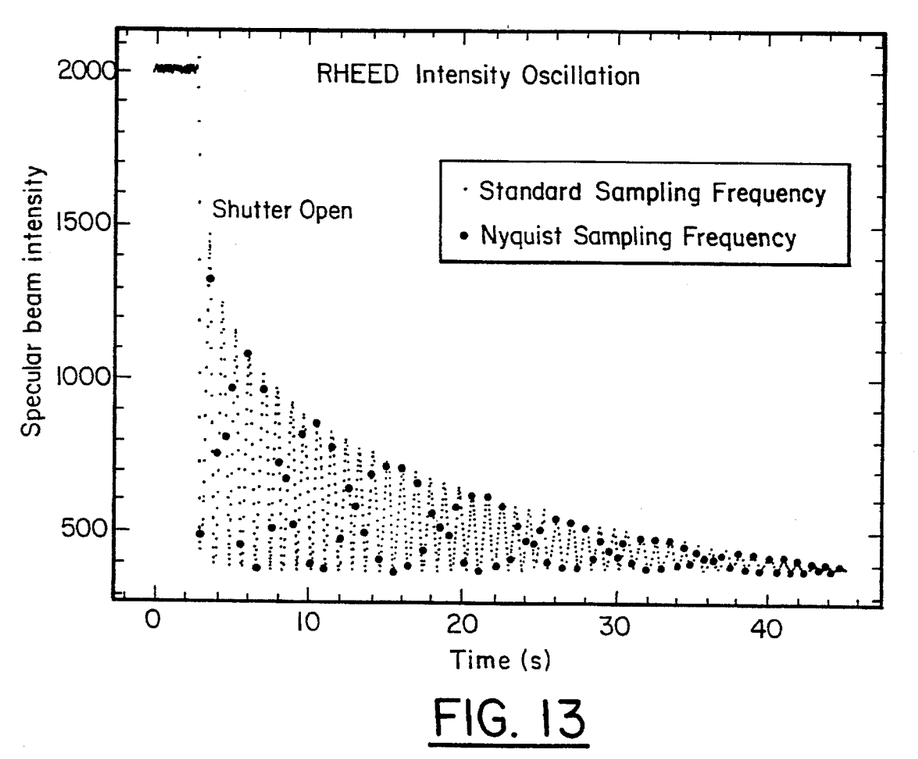
FIG. 13 is a waveform diagram superimposing a Nyquest sampling frequency over a standard RHEED intensity oscillation illustrating that the Nyquest samples contain all of the information needed to quantify the original RHEED signal.

The Nyquist sampling theorem depicted graphically in FIG. 13 states that if a band limited signal is sampled instantaneously at regular intervals and at a rate at least twice the highest significant message frequency, then the samples contain all of the information of the original signal. Typically MBE growth rates are on the order of about 1 μm/h, which corresponds to a RHEED oscillation frequency of about 0.98 Hz. Therefore, according to the Nyquist sampling theorem, the RHEED oscillations should be sampled at least two times per second so that significant information will not be lost. This sampling frequency corresponds to a substrate rotation speed of at least 120 RPM, assuming one sample per rotation.

Figure 7:
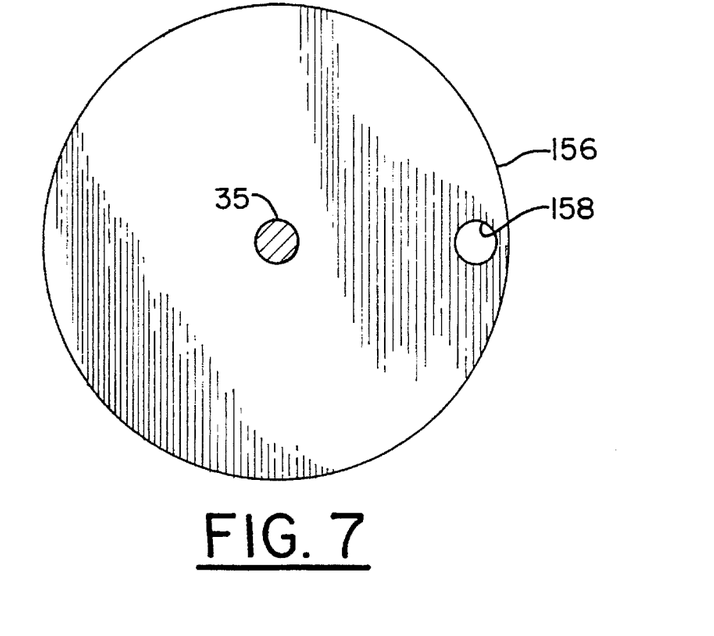
FIG. 7 is a plan view of the synchronization disc for mounting on a shaft.
Figure 8:
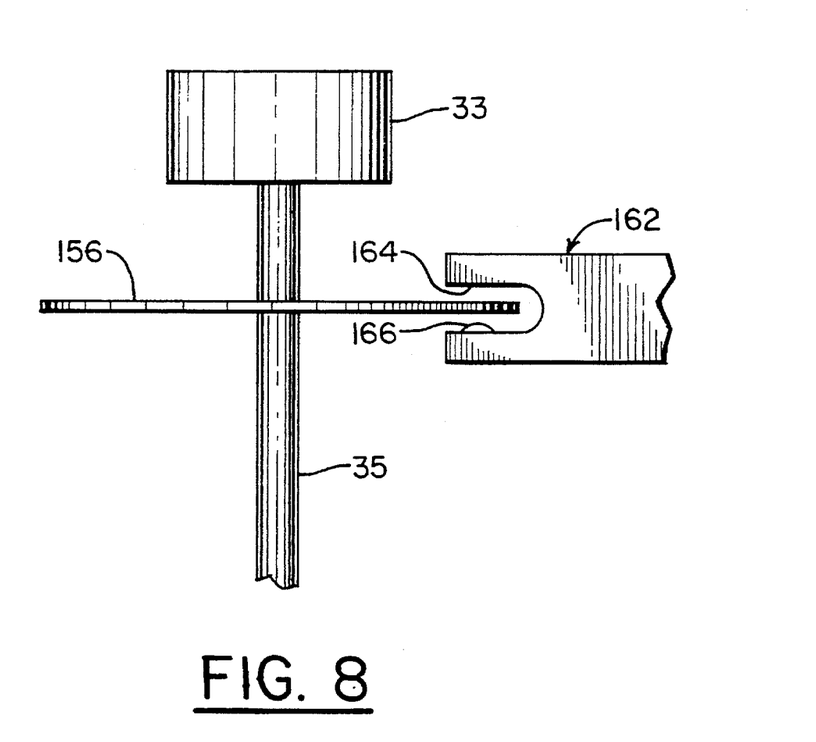
FIG. 8 is a schematic view of the synchronization disc assembled together with the source/sensor module.

Consequently, a synchronization disc 156, shown in FIG. 7, having a small opening 158 cut in the outer periphery, may be axially positioned on shaft 35. An optical source/sensor module 162, shown in FIG. 8, is placed over the disc 156 to aid in the determination of when a single revolution of the substrate 11 is complete. For example, when the synchronization opening 158 passes through the source/sensor module 162, light from the source 164 is passed through the opening 158 to a sensor 166, which provides a short pulse or trigger signal indicating that a revolution is complete. The synchronization disc 156 can be mounted on and rotated with the shaft 35 and locked into position in such a way that the synchronization opening 158 is directly over the source/sensor module 162 at the point in time when a sample should be taken. The short pulse or trigger signal is sent to a sample and hold amplifier 182. The sample and hold amplifier 182, upon receiving the trigger signal, holds the value received from the current amplifier 108 until it can be transferred to the computer 112. At the same time the trigger signal is sent to a time stamper board 180, which records the point in time at which the signal was recorded. The information is then transferred to the computer 112, providing it with the required time versus RHEED intensity data necessary for fast Fourier transform analysis.

Figure 9:
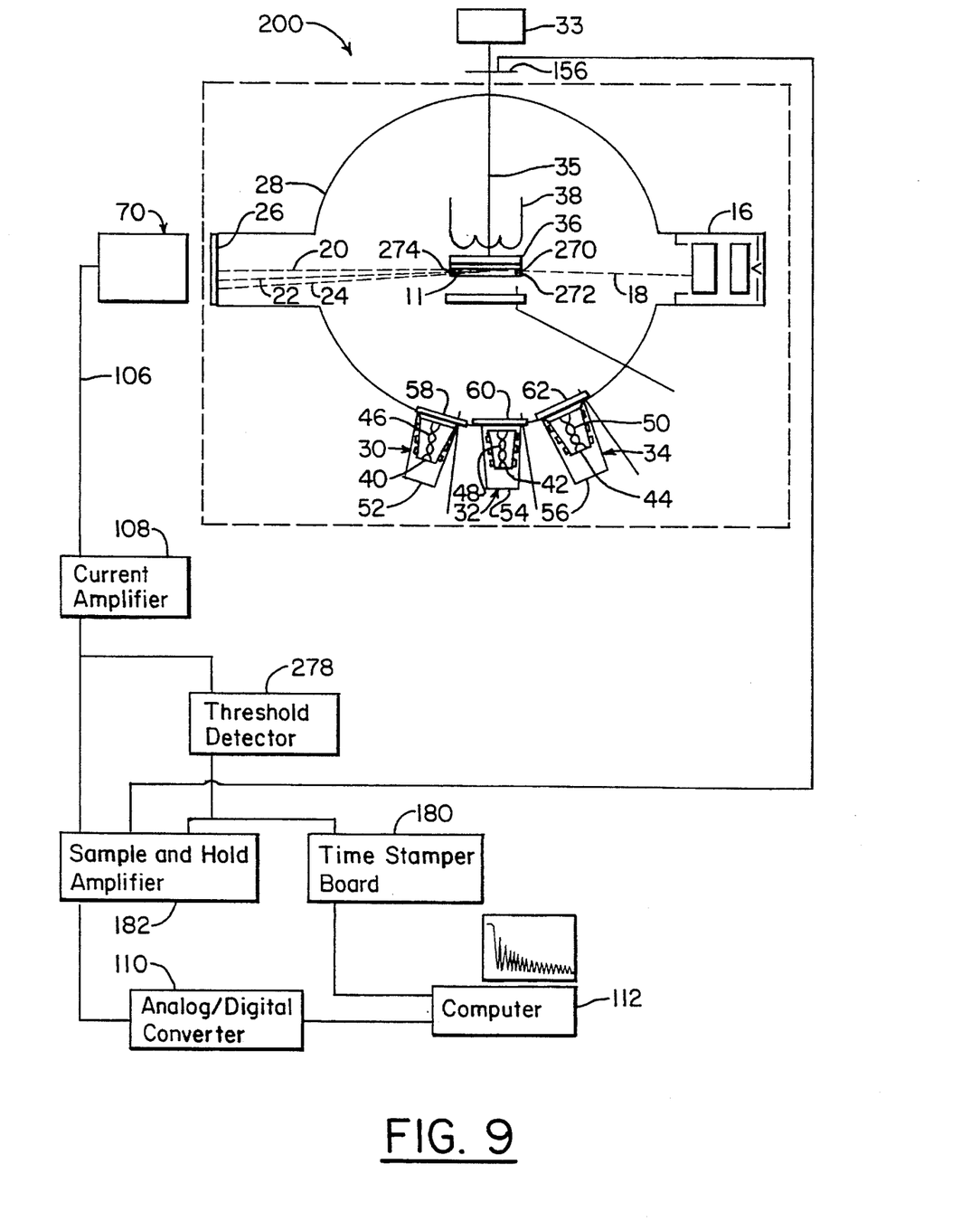
FIG. 9 is a schematic view showing a third embodiment crystal growth apparatus of the present invention having an electron beam blocking rim around the perimeter of the sampling stage with an entrance and exit slot therein.
Figure 10:
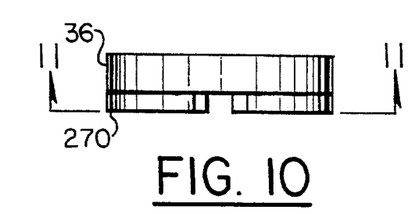
FIG. 10 is a side view of the substrate stage of FIG. 9 having an electron beam blocking rim.
Figure 11:
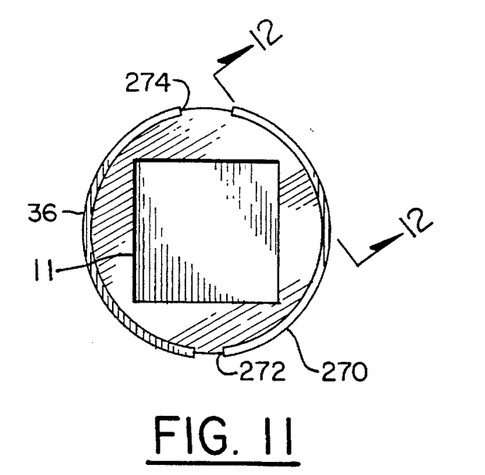
FIG. 11 is a bottom plan view of the substrate stage and electron beam blocking rim of FIG. 10 showing the entrance and exit slots and the substrate where the crystal film is deposited.
Figure 12:
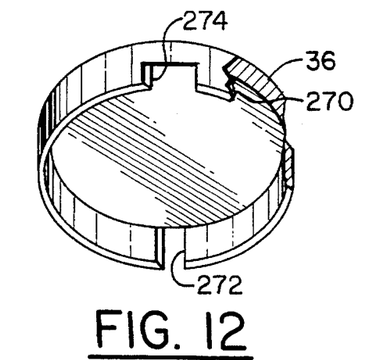
FIG. 12 is a perspective view of the sampling stage.

In an alternate proposed embodiment 200, shown in FIG. 9, a thin electron beam blocking rim or shield 270 may be attached to the outer perimeter of sampling stage 36 to block the electron beam 18, except at certain intervals. The blocking rim 270 shown in more detail in FIGS. 10–12, has two diametrically opposed apertures 272, 274 through which the election beam 18 can pass when they are aligned with the beam 18. In such alignment, which occurs at one location or place in the substrate 11 and rim 270 rotation, the incoming electron beam 18 shown in FIG. 9 enters through the narrower aperture 272, strikes the substrate surface 11, and the resulting diffracted electron beams 20, 22, 24 may exit the wider aperture 274. The diametrically opposed arrangement of apertures 272, 274 provides for a self synchronized signal. For example, when the aperture 272 is in a position that allows the electron beam 19 to impinge on the substrate 11 and then exit through aperture 274, the scattered beam 20, 22, 24 forms a substrate diffraction pattern D on the phosphor screen 26. The current produced by the detector 70 when that alignment occurs is fed into a current amplifier 108 and converted to a voltage, which is significantly above some background level. The resulting voltage from the current amplifier 108 causes the threshold detector 278 to generate a trigger pulse, which is sent to the time stamper board 180, for recording the event time, and to the sample and hold amplifier 182 for recording the RHEED intensity level, thus providing the computer 112 with the required time versus RHEED intensity data required for analysis in a self synchronized mode. This configuration could provide two signals per revolution, that is, the electron beam 18 may also enter after 180° rotation of the substrate 11 and rim 270 through the wider aperture 274, and at least some of the scattered beam 20, 22, 24 can exit through the narrower aperture 272. That occurrence can be ignored, however, by using the synchronization disc 156, discussed above, send a signal to the computer 112 or to the sample and hold amplifier 182 to ensure that a sample current or voltage is recorded only at the proper orientation.

EXAMPLE

An example crystal growth monitoring apparatus 10 substantially as described above was set up and operated to observe MBE RHEED intensity oscillation results. A Perkin-Elmer MBE-400 system was used for the growth of GaAs, AlAs and AlGaAs on GaAs substrates. The GaAs substrates were prepared by thermally desorbing a chemically prepared oxide layer in vacuum. The Ga source fluxes were adjusted to give GaAs growth rates between 0.25–1.0 μm/h, and the Al fluxes were adjusted to give AlAs growth rates of 0.1–0.5 μm/h. The substrate temperatures during growth, were monitored by a thermocouple and optical pyrometer measurements ranged from 580° C. to 620° C. The RHEED image is generated with a standard Perkin-Elmer Physical Electronics RHEED gun operated at 10 KV. While the following data presented was obtained from a stationary sample, the data is theoretically representative of that obtained during sample rotation (as dictated by the Nyquist thereom). Data may be obtained for sample rotation by placing an optical source/sensor module 162 over the synchronization disc 156 having an axis defined by shaft 35. The motor 33 may be varied in speed from 0 to 200 revolutions per minute.

The light image 66 obtained on the phosphor screen 26 is captured with the detector apparatus 70, the intensity of image 66 is converted to a current by the photodiode 78, which is directed into a current amplifier 108 via a graphite impregnated cable 106. The resulting voltage is directed into the analog to digital converter 110, where the analog data is converted to digital information. The digital information is directed into the computer 112 and analyzed. The software package, described above, provides the capability for developing digital signal processing programs to accomplish such tasks as base line corrections to compensate for drift, digital filtering to remove undesired noise components, fast Fourier transform analysis, and power spectrum measurements.

Figure 15:
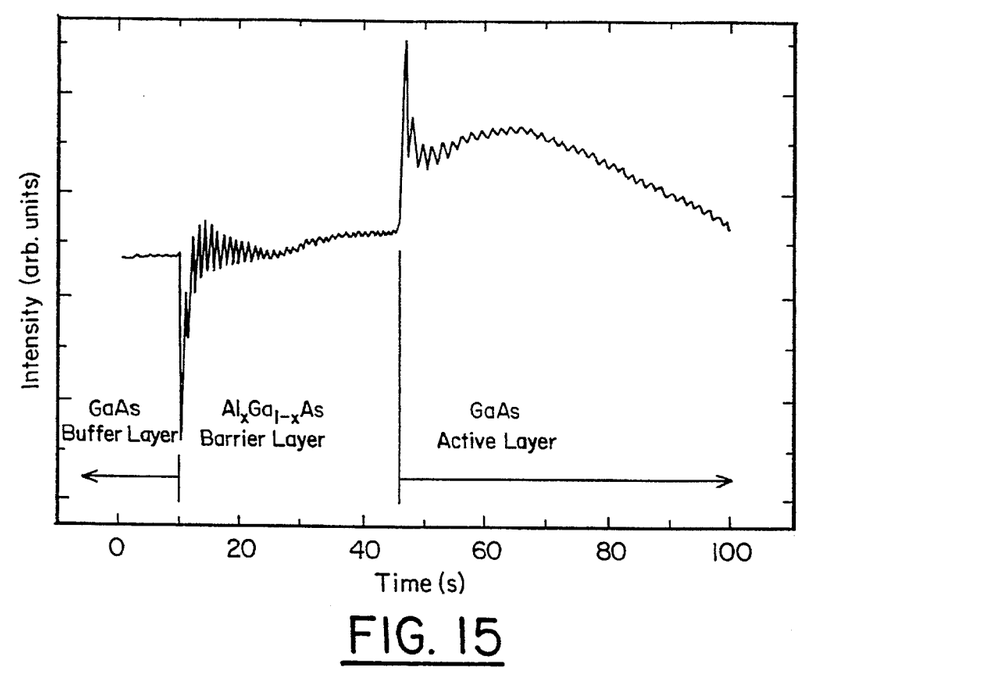
FIG. 15 is a waveform diagram illustrating the one example of the RHEED intensity oscillations recorded during a portion of the growth of a GaAs/AlGaAs double heterostructure device.
Figure 16:
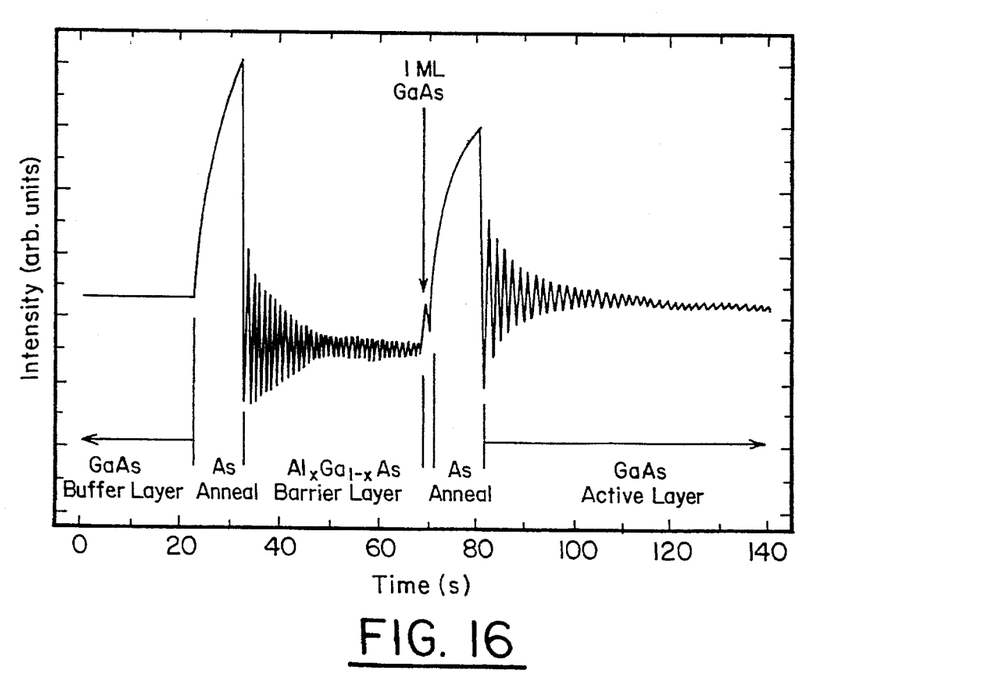
FIG. 16 is a waveform diagram illustrating one example of the RHEED intensity oscillations recorded during a portion of the growth of a GaAs/AlGaAs double heterostructure device having growth interrupts (arsenic anneals) at each of the heterointerfaces.

FIG. 14 is a recorder trace of RHEED oscillations taken at various points in time during an uninterrupted growth run in which a GaAs think film was grown on a high quality GaAs substrate at 600° C. The oscillations are visually recognizable up to 1800 consecutive oscillations (about 0.51 µm). Past this point it is difficult to visually detect the oscillations, however, the fast Fourier transform analysis routine can extract the signal from the noise up to 2650 oscillations (about 0.75 µm). FIGS. 15 and 16 are of RHEED intensity oscillations recorded during a portion of the growth of a GaAs/AlGaAs double heterostructure device. As is clear from FIG. 15, one period of oscillation of the intensity of the RHEED pattern corresponds to one monolayer, thus, the composition ratio x of the mixed crystal $Al_xGa_{1-x}As$ can be directly determined from the frequency of the oscillations. That is, when the oscillation frequency of both GaAs [f(GaAs)] and AlAs [f(AlAs)] is measured, the composition ratio $x_1$ is obtained from equation (1). Similarly, when the oscillation frequency of both GaAs [f(GaAs)] and AlGaAs [f(AlGaAs)] is measured, the composition ratio $x_2$, is obtained from equation (2).

$$x_1 = \frac{f(AlAs)}{f(GaAs) + f(AlAs)} \quad (1)$$

$$x_2 = \frac{f(AlGaAs) - f(GaAs)}{f(AlGaAs)} \quad (2)$$

Equation (1) gives the Al composition ratio x of the mixed crystal $Al_xGa_{1-x}As$ when the oscillation frequencies of AlAs and GaAs are known and AlAs and GaAs are simultaneously grown. Equation (2) gives the concentration of Al when the oscillation frequencies of AlGaAs and GaAs are known and AlGaAs and GaAs are grown.

Therefore, the method of the present invention has an advantage that the composition ratio can be determined at any time during the crystal growth out to about 0.75 µm. The composition ratio obtained according to the present invention can be obtained for a longer period of time than the prior art methods.

The crystal films from which the RHEED data was taken for FIGS. 15 and 16 are identical in structure; however, the crystal film in FIG. 16 had growth interrupts (arsenic anneals) at each of the heterointerfaces and the crystal film in FIG. 15 did not.

The foregoing description is considered as illustrative only of the principles of the invention. Furthermore, since numerous modifications and changes will readily occur to those skilled in the art, it is not desired to limit the invention to the exact construction and process shown as described above. Accordingly, all suitable modifications and equivalents may be restored to falling within the scope of the invention as defined by the claims which follow.

I claim:

1. A monitoring apparatus for detecting intensity oscillations of a RHEED luminescent pattern on a screen that luminesces in response to impingement of electrons generated by an electron beam during growth of a crystalline film on a substrate, comprising:

focusing means for selecting a spot of the RHEED luminescent pattern on the screen at which luminescent intensity can be detected;

detector means for converting light emanating from said spot into an electronic signal indicative in real time of the luminescent intensity;

filter means for transmitting primarily light of the wavelength that are produced by the screen and that reflects or absorbs light of different wavelengths;

amplifying means for amplifying said electronic signal;

processing means for reading each oscillation cycle of intensity of the luminescent spot;

rotating means for rotating said substrate and crystalline film; and sampling means for sampling said electrical signal instantaneously in synchronization with a revolution of said substrate and crystalline film.

2. The monitoring apparatus of claim 1, wherein said focusing means is an objective lens which focuses light onto said detector means.

3. The monitoring apparatus of claim 2, wherein said detector means is a photosensitive device which responds to impinging light by producing an electrical signal that is indicative in real time of the intensity of the light emanating from said spot.

4. The monitoring apparatus of claim 3, wherein said amplifying means converts said electrical signal into a voltage that is indicative in real time of the magnitude of said electrical signal.

5. The monitoring apparatus of claim 4, wherein an analog to digital converter converts said voltage to digital signals that are indicative in real time of the amplitude of said voltage, and said processing means for converting said digital signals into said reading.

6. The monitoring apparatus of claim 1, comprising a sensor means for detecting a revolution of said substrate and producing a trigger signal at the completion of the revolution.

7. The monitoring apparatus of claim 6, wherein said sampling means is a sample hold amplifier which receives said electrical signal and said trigger signal at the completion of the revolution, and samples said electronic signal in response to said trigger signal.

8. The monitoring apparatus of claim 7, wherein said rotating means has a shield that is impervious to an electron beam and said shield has two diametrically opposed apertures that allow the electron beam to strike said substrate and crystalline film at an angle such that it may pass through one of said apertures, reflect off said crystalline film, and pass through the other of said apertures to said screen.

9. The monitoring apparatus of claim 8, wherein one of said apertures in said shield is smaller than the other of said apertures.

10. The monitoring apparatus of claim 9, wherein said electronic signal is sampled only when the incident electron is passing through said smaller aperture and the diffracted electron beam is passing through the larger aperture.

11. The monitoring apparatus of claim 10, further comprises a threshold detector means for directing said electronic signal to a sample hold amplifier when said electronic signal reaches a preselected threshold, said trigger signal is directed to said sample hold amplifier, and said electronic signal is sampled in response to said trigger signal.

12. A monitoring apparatus for detecting intensity oscillations of a RHEED luminescent pattern on a screen that luminesces in response to impingement of an electron beam during growth of a crystalline film on a substrate comprising:

focusing means for selecting a spot of the RHEED luminescent pattern on the screen at which luminescent intensity can be detected;

detector means for convening light emanating from said spot into an electronic signal indicative in real time of the luminescent intensity;

rotating means for rotating substrate and crystalline film;

amplifying means for amplifying said electronic signal;

processing means for reading each oscillation cycle of intensity of the luminescent spot; and a sensor means for detecting a revolution of said substrate and producing a trigger signal at the completion of the revolution.

13. The monitoring apparatus of claim 12, wherein said focusing means is an objective lens which focuses light onto said detector means.

14. The monitoring apparatus of claim 13, wherein said detector means is a photosensitive device which responds to impinging light by producing an electrical signal that is indicative in real time of the intensity of the light emanating from said spot.

15. The monitoring apparatus of claim 14, wherein said amplifying means converts said electrical signal into a voltage that is indicative in real time of the magnitude of said electrical signal.

16. The monitoring apparatus of claim 15, wherein an analog to digital converter converts said voltage to digital signals that are indicative in real time of the amplitude of said voltage, and said processing means for converting said digital signals into said reading.

17. The monitoring apparatus of claim 12, further comprising sampling means comprising a sample hold amplifier which receives said electrical signal and said trigger signal at the completion of the revolution, and samples said electronic signal in response to said trigger signal.

18. The monitoring apparatus of claim 17, wherein said rotating means has a shield that is impervious to an electron beam and said shield has two diametrically opposed apertures that allow the electron beam to strike said substrate and crystalline film at an angle such that it may pass through one of said apertures, reflect off said crystalline film, and pass through the other of said apertures to said screen.

19. The monitoring apparatus of claim 18, wherein one of said apertures in said shield is smaller than the other of said apertures.

20. The monitoring apparatus of claim 19, wherein said electronic signal is sampled only when the incident electron is passing through said smaller aperture and the diffracted electron beam is passing through the larger aperture.

21. The monitoring apparatus of claim 1, further comprises a threshold detector means for directing said electronic signal to a sample hold amplifier when said electronic signal reaches a preselected threshold, said trigger signal is directed to said sample hold amplifier, and said electronic signal is sampled in response to said trigger signal.

* * * * *